United States Patent
Wu

(10) Patent No.: US 7,212,085 B2
(45) Date of Patent: May 1, 2007

(54) FILTER ASSEMBLY WITH UNBALANCED TO BALANCED CONVERSION AND REDUCED NOISE

(75) Inventor: Tsung-Ying Wu, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 45 days.

(21) Appl. No.: 11/098,556

(22) Filed: Apr. 5, 2005

(65) Prior Publication Data

US 2006/0145786 A1   Jul. 6, 2006

(30) Foreign Application Priority Data

Dec. 30, 2004   (TW) .............................. 93141423 A

(51) Int. Cl.
*H03H 9/54*   (2006.01)
(52) U.S. Cl. .......................................... 333/189; 333/25
(58) Field of Classification Search ................ 333/187, 333/189, 25
See application file for complete search history.

(56) References Cited

U.S. PATENT DOCUMENTS 5,892,418 A * 4/1999 Onishi et al. ............... 333/193
6,670,866 B2 * 12/2003 Ella et al. ................... 333/133
2004/0257172 A1 * 12/2004 Schmidhammer et al. .. 333/133

FOREIGN PATENT DOCUMENTS

WO    WO 98/34345    * 8/1998

* cited by examiner

*Primary Examiner*—Barbara Summons
(74) *Attorney, Agent, or Firm*—Birch, Stewart, Kolasch & Birch, LLP

(57) ABSTRACT

A filter assembly capable of unbalanced to balanced conversion. An unbalanced to balanced conversion unit is coupled to an input terminal for transforming a received unbalanced signal thereat to a balanced signal and a lattice filter coupled between the unbalanced to balanced conversion unit and two output terminals for eliminating or rejecting the noise of the balanced signal.

18 Claims, 10 Drawing Sheets

US 7,212,085 B2

FILTER ASSEMBLY WITH UNBALANCED TO BALANCED CONVERSION AND REDUCED NOISE

BACKGROUND

The invention relates to a filter assembly of a front-end module used in mobile communication systems, and more specifically to a filter assembly capable of balanced to unbalanced conversion.

Currently, dual-band, tri-band and quad-band mobile phones are available for operating in different mobile communication systems. Dual-band mobile phones switch between the operating frequencies of 900 MHz and 1800 MHz, tri-band mobile phones switch between the operating frequencies of 900 MHz, 1800 MHz and 1900 MHz, and quad-band mobile phones switch between the operating frequencies of 900 MHz, 1800 MHz, 1900 MHz and 850 MHz. The quad-band communication system is characterized by support of media applications, high speed connectivity and fast audio and image downloads. Additionally, quad-band mobile phones are compatible with all mobile communication systems. Consequently, it is desirable to have a front-end module for accommodating to the quad-band mobile communication systems.

FIG. 1 shows a conventional front-end module in a mobile communication system. As shown in FIG. 1, the front-end module 10 comprises a duplexer 12, a power amplifier 22, a low noise amplifier 24 and an antenna 20. The duplexer 12 comprises two bandpass filters 14 and 16, a 90° phase shifter 18, an output terminal 13 coupled between the bandpass filter 14 and the power amplifier 22, an input terminal 15 coupled between the bandpass filter 16 and the low noise amplifier 24, and an antenna terminal 17 connected to the antenna 20.

A transmitted signal is amplified by the power amplifier 22 to the duplexer 12 via the output terminal 13. The bandpass filter 14 proceeds to allow the signal within a certain frequency band to pass therethrough and the antenna 20 then transmits the passed signal via the antenna terminal 17. Similarly, when receiving a signal, the antenna 20 feeds the received signal to the 90° phase shifter 18 via the antenna terminal 17 and the signal is then outputted to the bandpass filter 16, which applies the received signal to the low noise amplifier 24 via the input terminal 15. The low noise amplifier 24 then filters the noise in the low frequency (LF) signal passing through the passband filter 16 and amplifies the signal. In order to eliminate the quality degrading disturbance in the signal passing through the bandpass filter 16, which stems from the signal passing through the bandpass filter 14, a 90° phase shifter 18 is typically disposed therebetween to separate the transmitted and received signals by the difference in signal phases. The signal, however, must be transformed from an unbalanced signal to a balanced signal when outputted to the antenna terminal 17 via the output terminal 13 or inputted from the antenna 17 to the input terminal 15. Hence, an unbalanced to balanced conversion transformer (Balun) is required to be disposed before the bandpass filter 14 or after the bandpass filter 16 in the signal transmission path to reject the noise.

In recent years, when making filters and duplexers used in RF communication systems, the piezoelectric thin film process is typically employed in manufacturing ultrasonic components. The conventional piezoelectric thin film acoustic component can be roughly classified as a film bulk acoustic resonator (FBAR) or a solidly mounted resonator (SMR) depending on structure. SMR is supported by a Bragg reflector and FBAR is manufactured in Microelectromechanical (MEMS) surface micromachining or bulk micromachining to empty the parts below the lower electrode or supporting layer to enable the thin film structure to conform to the total reflection boundary condition of acoustic waves.

FIG. 2A is a schematic diagram of a film bulk acoustic resonator (FBAR) in a stacked crystal filter (SCF) arrangement. As depicted in FIG. 2A, the FBAR 30 comprises an input electrode 32, an output electrode 34, a grounded electrode 36, an upper piezoelectric layer 31, and a lower piezoelectric layer 33. The input electrode 32 receives a signal from the input terminal 35 and the upper piezoelectric layer 31 then generates a bulk acoustic wave to the lower piezoelectric layer 33 in response to the signal excitation, thereby a resonance is generated between the input electrode 32 and the output electrode 34. The output electrode 34 then outputs the signal to an output terminal 37. The FBAR 30 is only used for unbalanced signal transmission since the input and output signals share the grounded electrode 36.

In order to compensate for the defect of the FBAR 30, another FBAR in a SCF arrangement is provided as shown in FIG. 2B. The FBAR 40 comprises an input electrode 42, two output electrodes 46 and 48, a grounded electrode 44, an upper piezoelectric layer 41, a lower piezoelectric layer 43 and a dielectric layer 50. While the transmission principle is the same as the described operation, the FBAR 40, however, is capable of both balanced and unbalanced signal transmission due to the insulation of the dielectric layer 50. Thus, the unbalanced signal only exists at the input terminal 45 of the input electrode 42 and the grounded terminal of the grounded electrode 44 whereas the balanced signal is outputted to the output terminals 47 and 49 by the output electrodes 46 and 48.

FIG. 2C shows a conventional FBAR in a coupled resonator filter (CFR) arrangement. The FBAR 60 of FIG. 2C comprises an input electrode 62, two output electrodes 66 and 68, a grounded electrode 64, an upper piezoelectric layer 61, a lower piezoelectric layer 63, a plurality of first coupling layers 72 and a plurality of second coupling layers 74. The operating principle thereof is the same as the previously described operation because the FBAR 60 is similar to the FBAR 40 except that the dielectric layer 5Q is replaced with the interleaved first coupling layer 72 and the second coupling layer 74. The first coupling layer 72 and the second coupling layer 74 comprise different material having different acoustic impedance but the same thickness of a quarter-wavelength. Thus, the unbalanced signal only exists at the input terminal 65 of the input electrode 62 and the grounded terminal of the grounded electrode 64 whereas the balanced signal is outputted to the output terminals 67 and 69 by the output electrodes 66 and 68.

FIG. 3A shows a schematic diagram of the frequency response of the FBAR 40 in FIG. 2B. As shown in FIG. 3A, there are three resonant modes in the frequency response of FBAR 40. Generally speaking, there is only a passband in a common bandpass filter and the operating band of the quad-band mobile communication system is from 850 MHz to 1900 MHz, thus the modes outside the 1400 MHz to 1800 MHz frequency range cannot reject noise effectively, resulting in signal quality degradation. Hence, the FBAR 40 and FBAR 60 cannot meet the low noise requirement of the mobile communication systems.

FIG. 2D shows a solidly mounted resonator (SMR) in SCF arrangement and FIG. 3B is the frequency response thereof. As shown in FIG. 2D, the SMR 80 comprises an input electrode 82, two output electrodes 86 and 88, a grounded electrode 84, an upper piezoelectric layer 81, a lower piezoelectric layer 83, a dielectric layer 90, a plurality of first reflective layers 92, a plurality of second reflective layers 94 and a substrate 96. The operating principle of the SMR 80 is substantially similar to the FBAR 40 except that a plurality of first and second reflective layers 92 and 94 are disposed under the lower surface of the output electrode 88 for support, wherein the interleaved first reflective layer 92 and the second reflective layer 94 formed on the substrate 96 are acoustic reflectors and made of different materials having different acoustic impedance. The thickness of the first reflective layer 92 and the second reflective layer 94 is a quarter acoustic wavelength and thus when the acoustic wave progresses to the first and second reflective layers 92 and 94, a Bragg reflection which approximates a total reflection is formed and the resonant energy is then maintained in the SMR 80. The unbalanced signal only exists at the input terminal 85 of the input electrode 82 and the grounded terminal of the grounded electrode 84 whereas the balanced signal is outputted to the output terminals 87 and 99 by the output electrodes 86 and 88. FIG. 3B shows a frequency response curve 140 of the SMR 80 when the first reflective layer 92 and the second reflective layer 94 are made of tungsten (W) and $SiO_2$ respectively, and a frequency response curve 130 when the first reflective layer 92 and the second reflective layer 94 are made of AlN and $SiO_2$ respectively. Because the acoustic impedance ratio between AlN and SiO2 is smaller than that between W and $SiO_2$, a narrower reflection bandwidth having better noise rejection performance in the bandpass filter is obtained. The reflectivity of the reflective layers with smaller acoustic impedance ratio, however, is worse, thus there exists a need for more layers. Consequently, the propagation route of the acoustic wave is increased and the Q value thereof is also degraded due to the transmission loss.

SUMMARY

In view of the above, the invention provides a filter assembly capable of unbalanced to balanced conversion and better stopband noise rejection.

According to one aspect of the invention, the filter assembly used in a front-end module of the mobile communication system comprises an unbalanced to balanced conversion unit coupled to an input terminal for transforming a received unbalanced signal thereat to a balanced signal and a lattice filter coupled between the unbalanced to balanced conversion unit and two output terminals for eliminating or rejecting the noise of the balanced signal.

The lattice filter can be used as an acoustic component, thus, filters such as FBARs in Stacked Crystal Filter (SCF) or Coupling Resonator Filter (CRF) arrangements, or SMRs can be adopted with the lattice filter of the filter assembly in the invention for eliminating the extra resonant modes of the unbalanced to balanced conversion unit to obtain a filter assembly with high Q value, low insertion loss and high frequency stop band attenuation.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

The present invention will become more fully understood from the following detailed description and the accompanying drawings, which are given by way of illustration only, and thus are not limitative of the present invention, and in which.

DETAILED DESCRIPTION

The invention solves the problem that present a front-end module for a mobile communication system is not capable of unbalance to balanced conversion using only the piezoelectric film acoustic component or a filter assembly. Only the principle and operation of the main components of the invention are described in the following, and details of other related art components such as FBAR, SMR, SCF and CRF are therefore omitted.

Figure 4A:
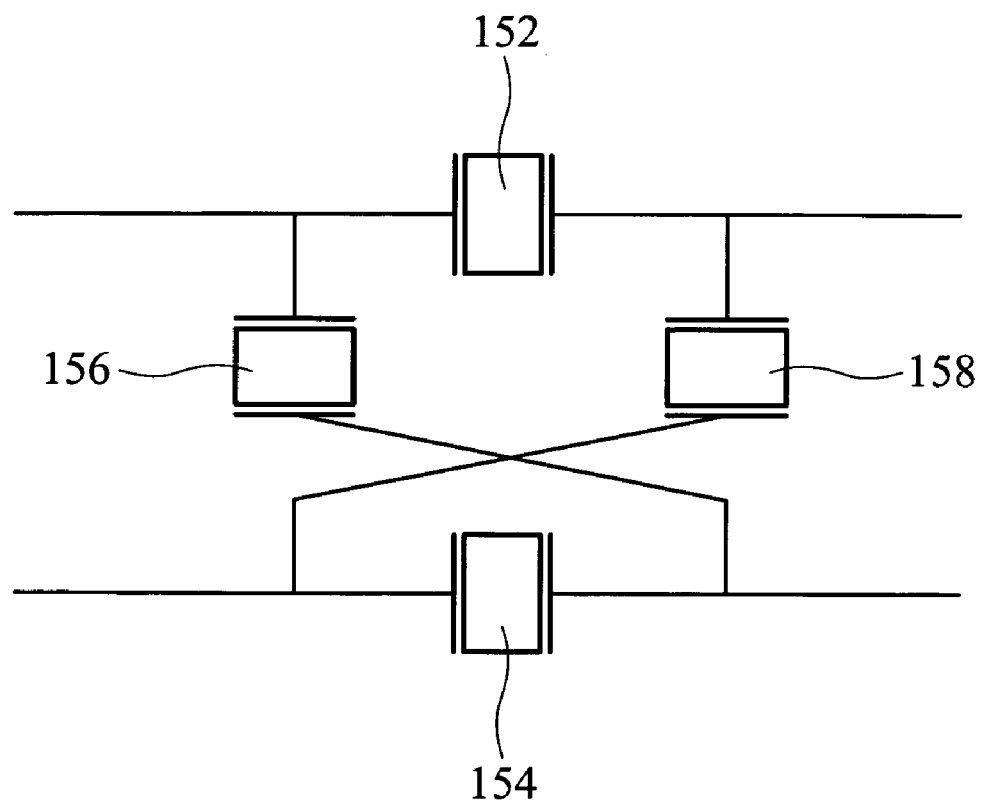
FIG. 4A is a schematic diagram of an acoustic component according to an embodiment of the invention.
Figure 4B:
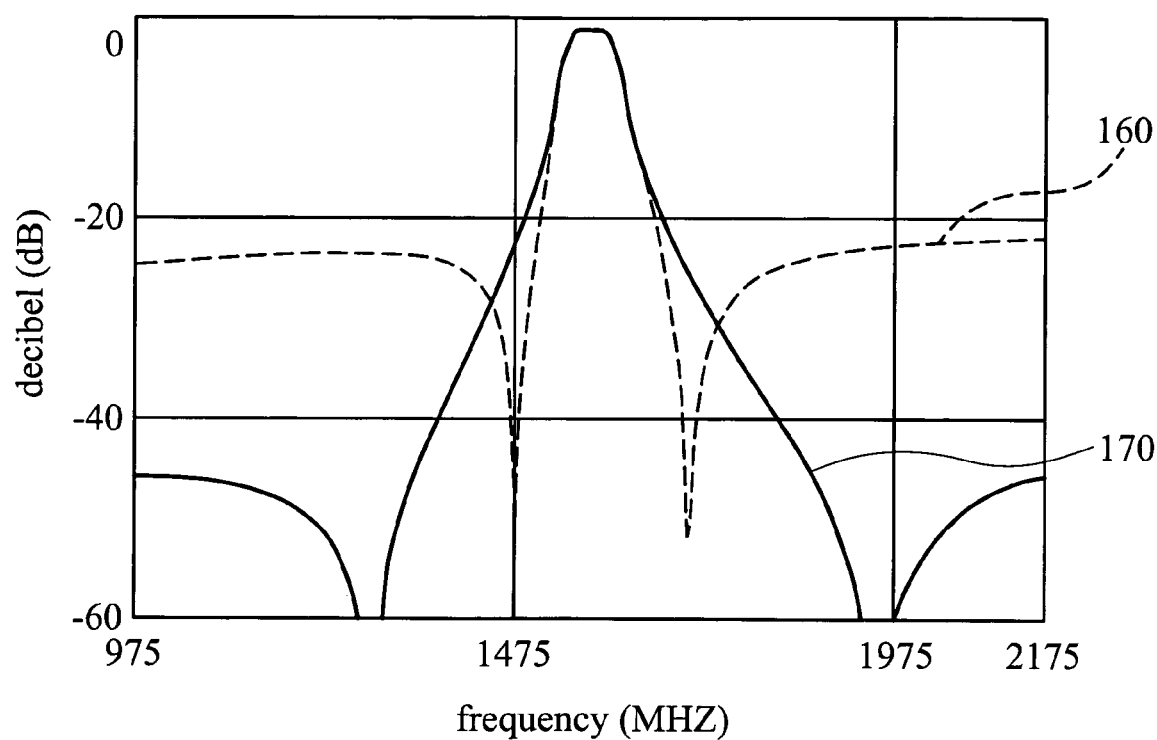
FIG. 4B is the frequency response of the acoustic component in FIG. 4A.

With reference to FIGS. 4A and 4B, FIG. 4A is an acoustic component according to an embodiment of the invention and FIG. 4B shows the frequency response thereof. As shown in FIGS. 4A and 4B, a lattice filter 150 comprising four single port FBARs is adopted as an acoustic component in this embodiment, wherein a first resonator 152 and a second resonator 154 are disposed according to the signal transmission direction and the third resonator 156 and the fourth resonator 158 are disposed perpendicular to the signal transmission direction. Furthermore, the electrode area of the first resonator 152 is the same as that of the second resonator 154 and greater than that of the third resonator 156 which is the same as the electrode area of the fourth resonator 158. The greater the electrode area ratio between the electrode area of the first resonator 152 and that of the third resonator 156, the narrower the bandwidth of the frequency response of the lattice filter 150.

Figure 5A:
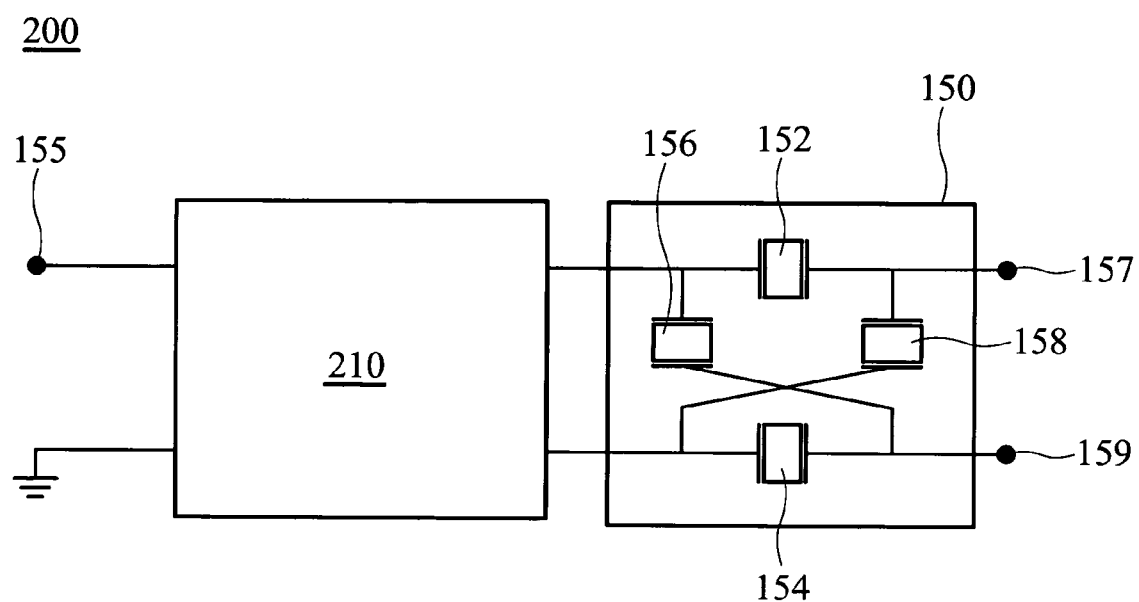
FIG. 5A is a schematic diagram of a filter assembly according to an embodiment of the invention.
Figure 5B:
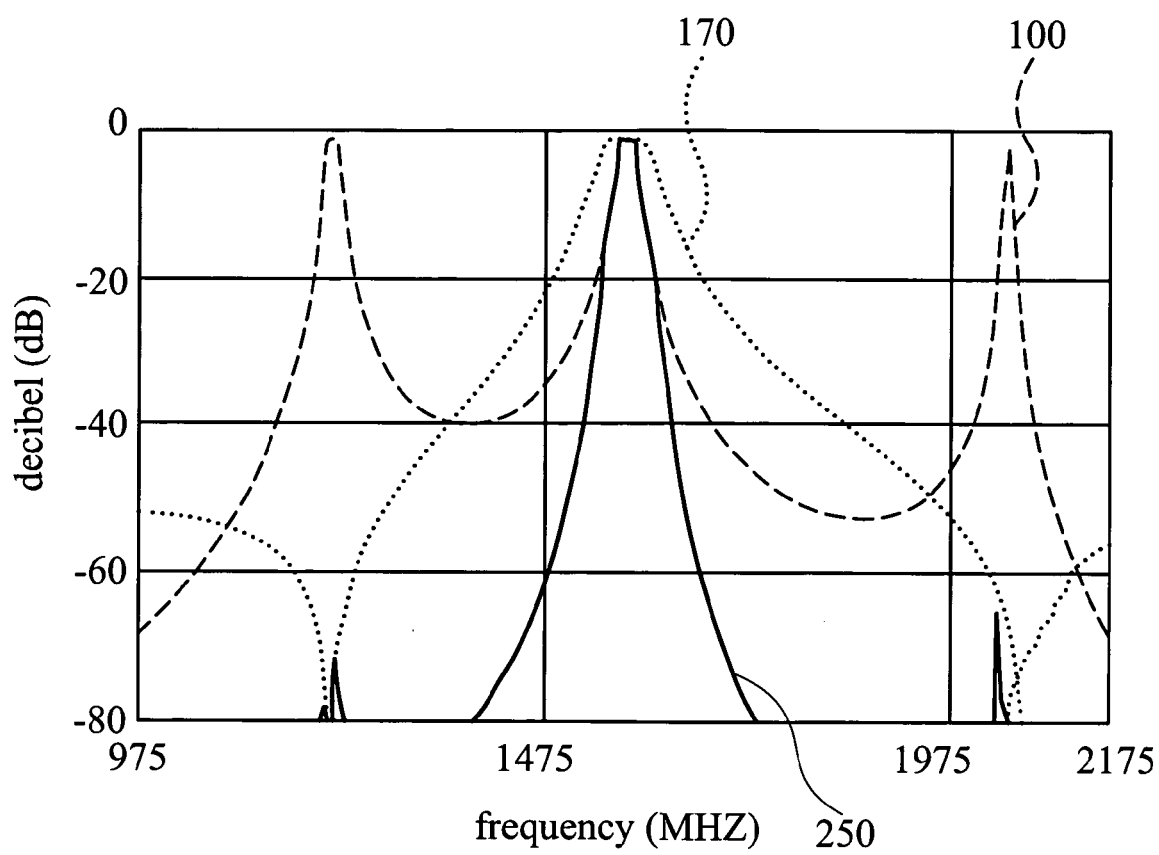
FIG. 5B is the frequency response of the filter assembly in FIG. 5A.

For instance, as the curve 160 of FIG. 4B shows, when the electrode area ratio between the electrode area of the first resonator 152 and that of the third resonator 156 is 1.2, there are one central passband having a center frequency of 1600 MHz, and two noise stop bands having boundary frequencies of 1500 MHz and 1700 MHz, in the frequency response of lattice filter 150. When the electrode area ratio between the electrode area of the first resonator 152 and that of the third resonator 156 is adjusted to 1.02, as the curve 170 of FIG. 4B shows, there are one central passband having a center frequency of 1600 MHz, and two noise stop bands having boundary frequencies of 1300 MHz and 1900 MHz. It can be derived from above that the center frequency does not vary when the corresponding resonator area ratio of the lattice filter 150 is reduced, but the bandwidth of the central passband widens, wherein the boundary frequencies move towards the each side of the frequency response diagram. With reference to FIGS. 5A and 5B, FIG. 5A is a filter assembly according to an embodiment of the invention and FIG. 5B shows the frequency response thereof. As shown in FIGS. 5A and 5B, the filter assembly 200 of the embodiment comprises an unbalanced to balanced conversion unit 210, a lattice filter 150, an input terminal 155 and two output terminals 157 and 159.

In this embodiment, the unbalanced to balanced conversion unit 210 can be a bandpass filter, a FBAR in SCF or CRF arrangements or a SMR. Those skilled in the art will be familiar with various ways of implementing the unbalanced to balanced conversion unit 210 with components capable of unbalanced to balanced conversion.

With reference to FIG. 5A, the lattice filter 150 comprises a first resonator 152 and a second resonator 154 coupled in series with the output terminal of the unbalanced to balanced conversion unit 210, a third resonator 156 coupled in parallel with the unbalanced to balanced conversion unit 210 and the second resonator 154, between the output terminals 157 and 159, and a fourth resonator 158 coupled in parallel with the unbalanced to balanced conversion unit 210 and the first resonator 154 between the output terminals 157 and 159.

When an unbalanced signal is inputted to the filter assembly 200 via the input terminal 155, the frequency response of the output signal of the filter assembly 200 at terminals 157 and 159 is equal to that of the unbalanced to balanced conversion unit 210 plus that of the lattice filter 150 because the filter assembly 200 employs an unbalanced to balanced conversion unit 210 coupled in series with a lattice filter 150.

Figure 1:
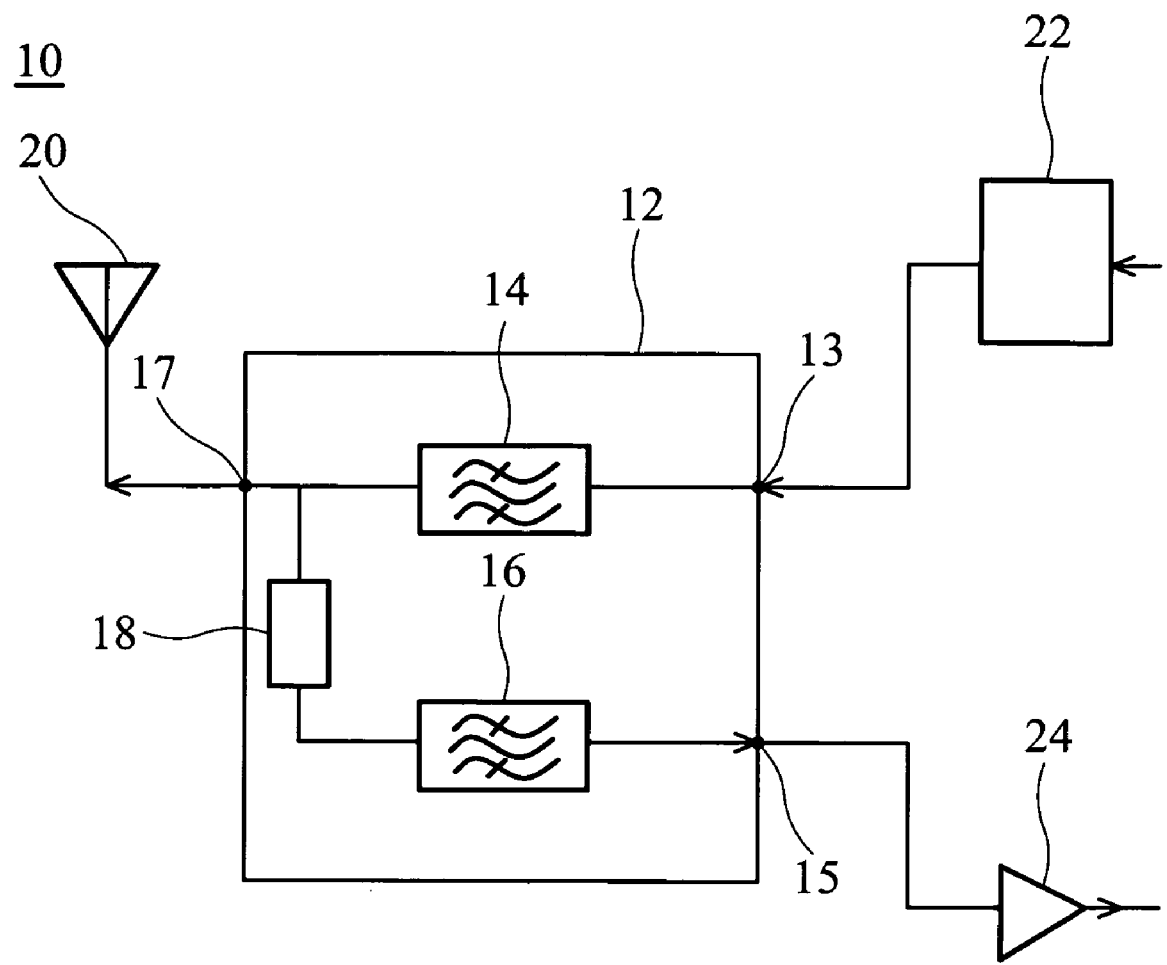
FIG. 1 is a schematic diagram of a conventional front-end module in a mobile communication system.
Figure 2A:
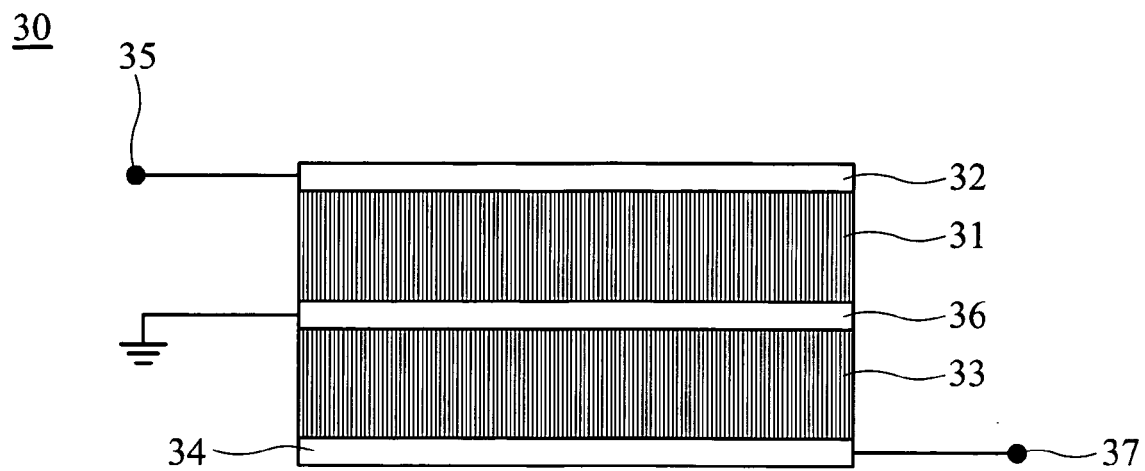
FIG. 2A is a schematic diagram of a thin film bulk acoustic resonator (FBAR) in stacked crystal filter (SCF) arrangement.
Figure 2B:
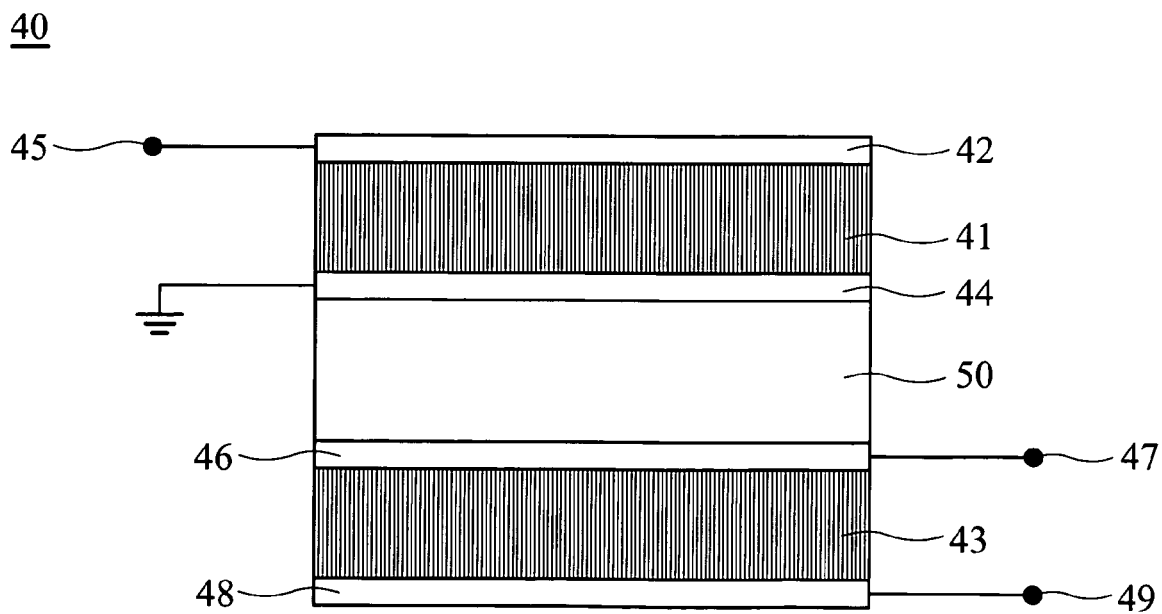
FIG. 2B is a schematic diagram of another thin film bulk acoustic resonator (FBAR) in stacked crystal filter (SCF) arrangement.
Figure 2C:
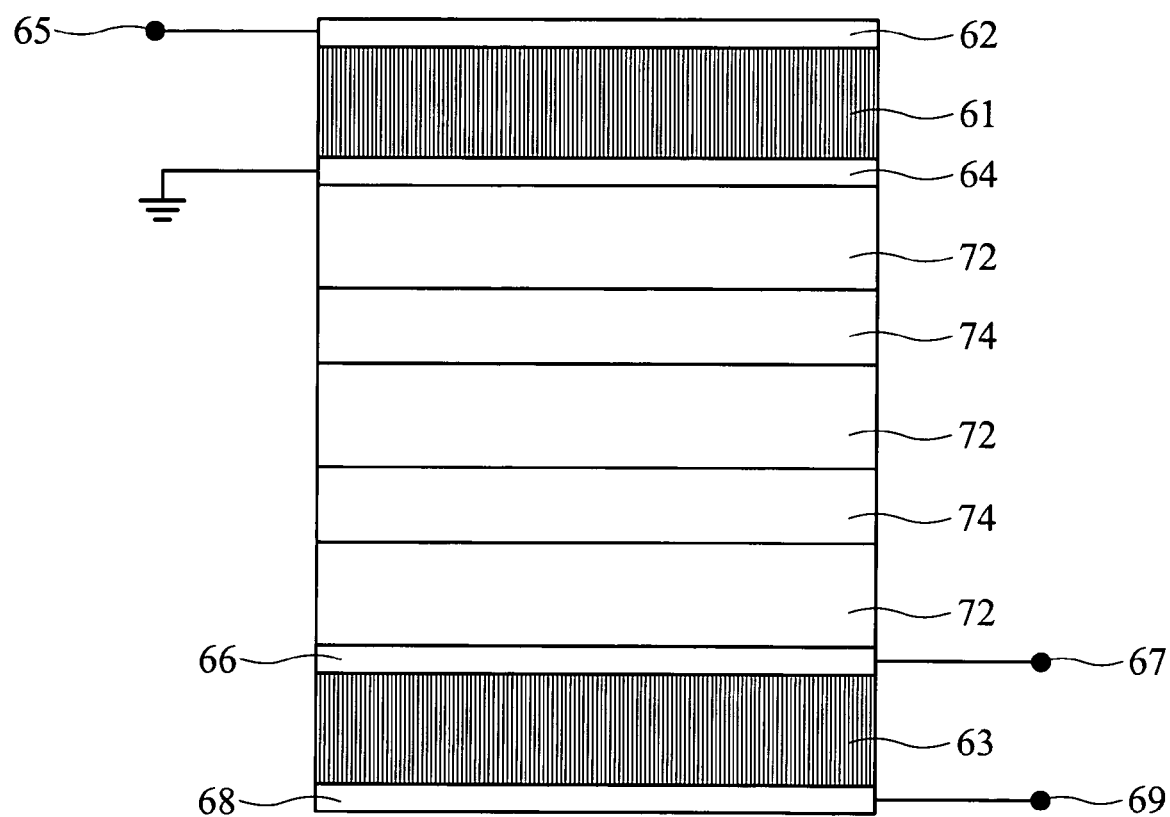
FIG. 2C is a schematic diagram of a thin film bulk acoustic resonator (FBAR) in coupling resonator filter (RCF) arrangement.
Figure 2D:
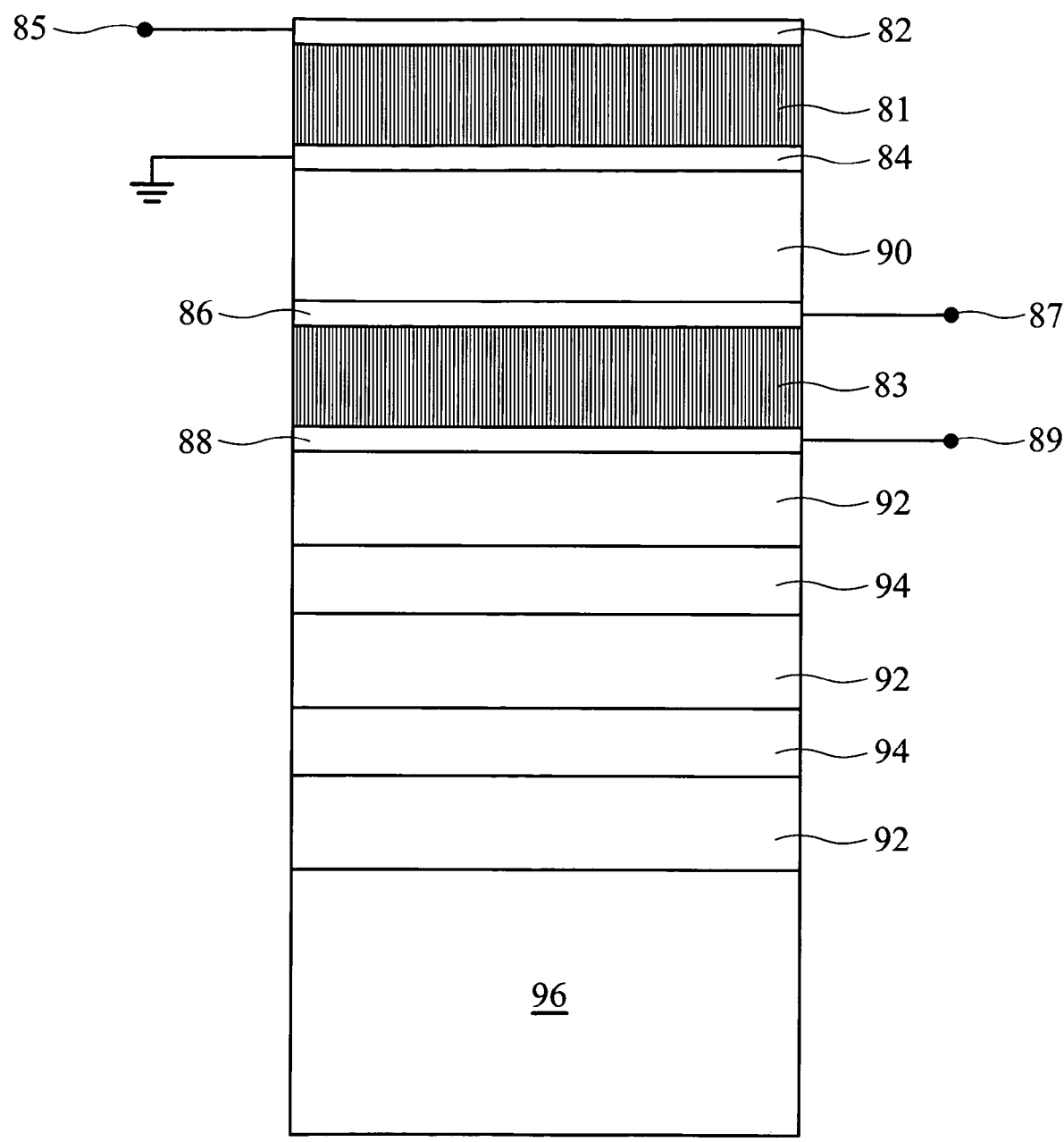
FIG. 2D is a schematic diagram of a solidly mounted resonator (SMR) in stacked crystal filter (SCF) arrangement.
Figure 3A:
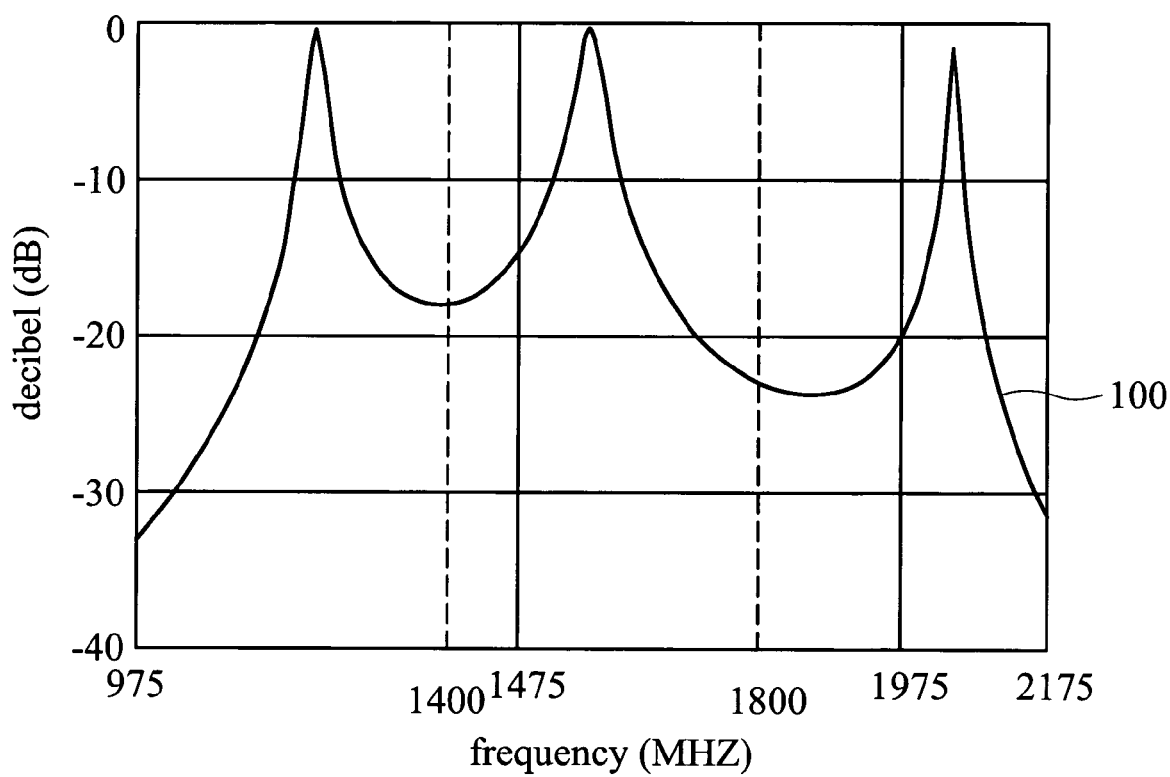
FIG. 3A is the frequency response of the FBAR in FIG. 2B.
Figure 3B:
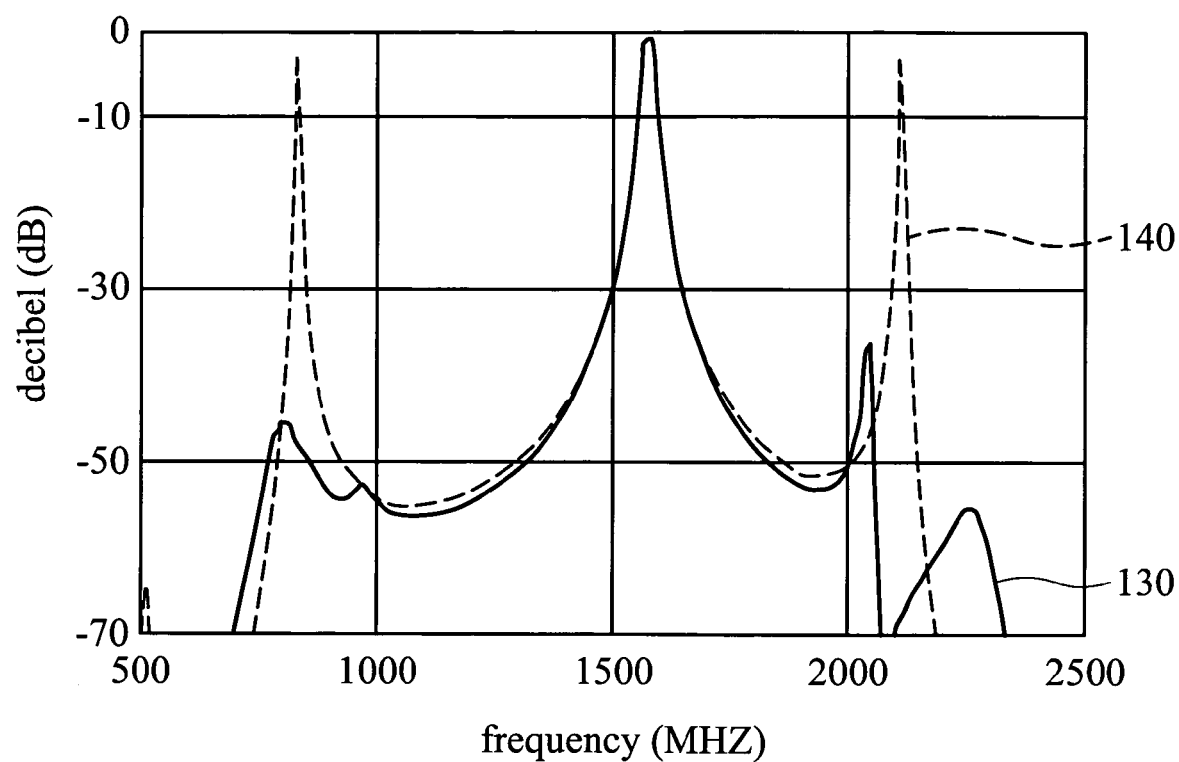
FIG. 3B is the frequency response of the FBAR in FIG. 2D.

As the frequency response curve 100 of FIG. 3A shows, there are one central passband having a center frequency of 1600 MHz, and two noise pass bands having boundary frequencies of 1200 MHz and 2100 MHz, in the frequency response of the unbalanced to balanced conversion unit 210. With the ability of the lattice filter 150 to adjust bandwidth as previously described, the center frequency of the lattice filter 150 can be adjusted to the center frequency of the unbalanced to balanced conversion unit 210 and the electrode area ratio between the electrode area of the first resonator 152 and that of the third resonator 156 (or the second and fourth resonators 154 and 158) of the lattice filter 150 is then adjusted until the boundary frequencies of the frequency response of the lattice filter 150 is the same as the center frequency of the noise passbands of the unbalanced to balanced conversion unit 210. Thus the two noise passbands of the unbalanced to balanced conversion unit 210 are counteracted whereas the central passband of the lattice filter 150 is greater than that of the unbalanced to balanced conversion 210. Frequency response curve 250 of the balanced signal outputted by the filter assembly 200 as shown in FIG. 5B is then obtained.

From the forgoing discussion, it can be seen that the invention not only solves the problem of present filters such as FBARs in SCF or RCF arrangements, or SMRs which extra resonant modes thereof allow noise to pass through, but also has the advantage of low insertion loss, high frequency stop band attenuation with bulk acoustic resonators having a high Q value.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A filter assembly comprising:
   a bandpass filter coupled to an input terminal, a first output terminal and a second output terminal;
   a first resonator coupled in series with the first output terminal;
   a second resonator coupled in series with the second output terminal;
   a third resonator coupled in parallel with the bandpass filter and the second resonator; and
   a fourth resonator coupled in parallel with the bandpass filter and the first resonator;
   wherein an unbalanced signal received at the input terminal is transformed to a balanced signal by the bandpass filter and fed to the first and fourth resonators and the second and third resonators via the first and second output terminals respectively;
   wherein the bandpass filter generates a first pass band having a first center frequency and at least two noise pass bands having different center frequencies and the combination of the first to fourth resonators generates a second pass band having a second center frequency and at least two noise rejection bands having different center frequencies; and
   wherein an electrode area ratio of the first resonator to the third resonator is adjusted so that the central frequencies of the two noise rejection bands are respectively the same as the central frequencies of the two noise pass bands.

2. The filter assembly of claim 1, wherein the bandpass filter comprises a piezoelectric thin film filter.

3. The filter assembly of claim 2, wherein the piezoelectric thin film filter is a film bulk acoustic resonator (FBAR).

4. The filter assembly of claim 3, wherein the FBAR is in a stacked crystal filter (SCF) arrangement or a coupled resonator filter (CRF) arrangement.

5. The filter assembly of claim 2, wherein the piezoelectric thin film filter is a solid mounted resonator (SMR).

6. The filter assembly of claim 1, further comprising a third output terminal coupled to the first and fourth resonators for outputting the balanced signal and a fourth output terminal coupled to the second and third resonators for outputting the balanced signal.

7. The filter assembly of claim 1, wherein the electrode area of the first resonator is the same as that of the second resonator and greater than that of the third resonator which is the same as the electrode area of the fourth resonator.

8. The filter assembly of claim 1, wherein the first, second, third and fourth resonators are single port FBARs, respectively.

9. A filter assembly comprising:
   an unbalanced to balanced conversion unit coupled to an input terminal for transforming a received unbalanced signal to a balanced signal; and a lattice filter coupled between the unbalanced to balanced conversion unit and two output terminals for eliminating or lowering the noise of the balanced signal;

wherein the unbalanced to balanced conversion unit generates a first pass band having a first center frequency and at least two noise pass bands having different center frequencies and the lattice filter generates a second pass band having a second center frequency and at least two noise rejection bands having different center frequencies; and wherein the lattice filter comprises a first resonator and a third resonator, both of which are respectively coupled with the unbalanced to balanced conversion unit, and an electrode area ratio of the first resonator to the third resonator is adjusted so that the central frequencies of the at least two noise rejection bands are respectively the same as the central frequencies of the at least two noise pass bands.

10. The filter assembly of claim 9, wherein the unbalanced to balanced conversion unit comprises a bandpass filter.

11. The filter assembly of claim 9, wherein the unbalanced to balanced conversion unit comprises a piezoelectric thin film filter.

12. The filter assembly of claim 11, wherein the piezoelectric thin film filter is a film bulk acoustic resonator (FBAR).

13. The filter assembly of claim 12, wherein the FBAR is in a stacked crystal filter (SCF) arrangement or a coupled resonator filter (CRF) arrangement.

14. The filter assembly of claim 9, wherein the unbalanced to balanced conversion unit comprises a solid mounted resonator.

15. The filter assembly of claim 9, wherein the second center frequency is approximately equal to the first center frequency and the bandwidth of the second pass band is greater than that of the first pass band.

16. The filter assembly of claim 9, wherein the lattice filter comprises:

the first resonator coupled in series with the unbalanced to balanced conversion unit;

a second resonator coupled in series with the unbalanced to balanced conversion unit;

the third resonator coupled in parallel with the unbalanced to balanced conversion unit and the second resonator; and a fourth resonator coupled in parallel with the unbalanced to balanced conversion unit and the first resonator.

17. The filter assembly of claim 16, wherein the first, second, third and fourth resonators are single port FBARs, respectively.

18. The filter assembly of claim 16, wherein an electrode area of the first resonator is the same as that of the second resonator and greater than that of the third resonator which is the same as the electrode area of the fourth resonator.

* * * * *